(12) United States Patent
Crippa et al.

(10) Patent No.: US 11,953,522 B2
(45) Date of Patent: Apr. 9, 2024

(54) PROBE HEAD FOR REDUCED-PITCH APPLICATIONS

(71) Applicant: TECHNOPROBE S.P.A., Cernusco Lombardone (IT)

(72) Inventors: Roberto Crippa, Cernusco Lombardone (IT); Stefano Felici, San Jose, CA (US)

(73) Assignee: TECHNOPROBE S.P.A., Cernusco Lombardone (IT)

( * ) Notice: Subject to any disclaimer, the term of this patent is extended or adjusted under 35 U.S.C. 154(b) by 104 days.

(21) Appl. No.: 17/783,440

(22) PCT Filed: Dec. 17, 2020

(86) PCT No.: PCT/EP2020/086709
§ 371 (c)(1),
(2) Date: Jun. 8, 2022

(87) PCT Pub. No.: WO2021/122950
PCT Pub. Date: Jun. 24, 2021

(65) Prior Publication Data
US 2023/0021227 A1    Jan. 19, 2023

(30) Foreign Application Priority Data

Dec. 20, 2019  (IT) .................. 102019000024964

(51) Int. Cl.
*G01R 1/073* (2006.01)
*G01R 1/067* (2006.01)
*G01R 31/28* (2006.01)

(52) U.S. Cl.
CPC ....... *G01R 1/0735* (2013.01); *G01R 1/06744* (2013.01); *G01R 1/06755* (2013.01);
(Continued)

(58) Field of Classification Search
CPC .............. G01R 1/0735; G01R 1/06744; G01R 1/06755; G01R 1/07357; G01R 1/07378;
(Continued)

(56) References Cited

U.S. PATENT DOCUMENTS

| 5,225,771 A | 7/1993 | Leedy |
| 2004/0070413 A1 | 4/2004 | Kasukabe et al. |

(Continued)

FOREIGN PATENT DOCUMENTS

| WO | 2012154584 A1 | 11/2012 | |
| WO | WO-2018149847 A1 * | 8/2018 | ......... G01R 1/06716 |
| WO | 2019219638 A1 | 11/2019 | |

OTHER PUBLICATIONS

International Search Report and Written Opinion for International Application No. PCT/EP2020/086709 (12 pages) (dated Mar. 22, 2021).

*Primary Examiner* — G. M. A Hyder
(74) *Attorney, Agent, or Firm* — Lucas & Mercanti, LLP

(57) ABSTRACT

A probe head for a testing apparatus integrated on a semiconductor wafer is disclosed having a first plurality of contact probes having a first transversal diameter, a second plurality of micro contact probes having a second transversal diameter, smaller than the first transversal diameter, and a flexible membrane having conductive tracks for connecting a first plurality contact probe with a corresponding second plurality micro contact probe. The second plurality contact probes are arranged between the testing apparatus and the flexible membrane, and the second plurality micro contact probes are arranged between the flexible membrane and a semiconductor wafer. The second plurality micro contact probes are configured to abut onto contact pads of a device under test integrated in the semiconductor wafer, with each first plurality contact probe being in contact with a corresponding second plurality micro contact probe through a (Continued)

conductive track of the flexible membrane to connect the device under test with the testing apparatus.

20 Claims, 9 Drawing Sheets

(52) U.S. Cl.
CPC ..... *G01R 1/07357* (2013.01); *G01R 1/07378* (2013.01); *G01R 31/2889* (2013.01)

(58) Field of Classification Search
CPC ............ G01R 31/2889; G01R 1/06733; G01R 1/07314; G01R 1/0491
See application file for complete search history.

(56) References Cited

U.S. PATENT DOCUMENTS

| | | |
|---|---|---|
| 2008/0061808 A1 | 3/2008 | Mok et al. |
| 2009/0280676 A1 | 11/2009 | Weiland et al. |
| 2012/0112778 A1 | 5/2012 | Johnson |
| 2018/0024166 A1* | 1/2018 | Acconcia ........... G01R 1/06755 324/750.25 |
| 2019/0361050 A1 | 11/2019 | Felici |
| 2019/0361051 A1 | 11/2019 | Vettori et al. |

* cited by examiner

PROBE HEAD FOR REDUCED-PITCH APPLICATIONS

CROSS-REFERENCE TO RELATED APPLICATIONS

This application is a 371 of PCT/EP2020/086709, filed Dec. 17, 2020, which claims the benefit of Italian Patent Application No. 102019000024964, filed Dec. 20, 2019.

TECHNICAL FIELD

The present invention relates to a probe head for a testing apparatus of electronic devices integrated on a semiconductor wafer and the following disclosure is made with reference to this field of application with the sole aim of simplifying the presentation thereof.

BACKGROUND ART

As it is well known, a probe head is essentially an electronic device configured to electrically connect a plurality of contact pads of a microstructure, in particular an electronic device integrated on a semiconductor wafer, with corresponding channels of a testing apparatus that performs the functionality testing thereof, in particular electric, or generically the test.

The test, which is performed on integrated devices, is particularly useful for detecting and isolating defective circuits as early as in the production phase. Normally, probe heads are therefore used for the electric test of devices that are integrated on wafers before cutting and assembling them inside a containment package.

A probe head essentially comprises a plurality of movable contact probes retained by at least one support, generally a pair of supports or guides that are substantially plate-shaped and parallel to each other. Said plate-shaped supports are provided with suitable holes and are arranged at a certain distance from each other in order to leave a free area or air gap for the movement and possible deformation of the contact probes, which are usually made of wires of special alloys with good electric and mechanical properties.

In particular, FIG. 1 schematically illustrates a probe head 1 comprising a plurality of probes 2 housed in an upper plate-shaped support or guide 3, usually also indicated as "upper die", and a lower plate-shaped support or guide 4, usually also indicated as "lower die", in respective guide holes 3A and 4A within which each of said contact probes 2 slides. As indicated in FIG. 1, the upper die 3 and the lower die 4 are suitably spaced apart by an air gap 7 which allows the contact probes 2 to deform.

Each contact probe 2 comprises a first end or contact tip 2A configured to abut onto a contact pad 6A of a device under test 6 integrated on a wafer 8 and a second end or contact tip 2B analogously configured to abut onto a contact pad 5A of a plurality of contact pads of a space transformer 5 of a probe card comprising the probe head 1, so as to realize the mechanical and electric contact between said device under test and a testing apparatus (not illustrated), which said probe head 1 forms a terminal element of. In particular, the "space transformer", besides contacting the probes, also allows spatially redistributing the contact pads 5A realized thereon with respect to the contact pads 6A being on the device under test 6, in particular relaxing the distance constraints between the centers of the pads made on the space transformer 5 with respect to those of the device under test 6. The space transformer 5 is suitably connected to the interface board with the testing apparatus (not illustrated).

The proper connection between the contact probes 2 and the contact pads 6A of the device under test 6 and the contact pads 5A of the space transformer 5 is ensured by the pressure of the probe head 1 on the device itself, the contact probes 2, which are movable within the guide holes 3A and 4A made in the dies 3 and 4, undergoing, during said pressing contact, a bending inside the air gap 7 and a sliding inside the respective guide holes 3A and 4A, in addition to a deformation of a respective probe body 2C thereof. Probe heads of this type are commonly called vertical probe heads.

In some cases, the contact probes are fixedly fastened to the probe head itself at an interface board with the testing apparatus: such probe heads are referred to as "blocked probe heads". In this case, the contact probes may be housed in a single guide which ensures the alignment thereof with the contact pads of the device under test or may be fixedly fastened to the interface board. In the latter case the probes may be described as "free body" probes.

The correct operation of a probe head is basically linked to two parameters: the vertical movement, or overtravel, of the contact probes and the horizontal movement, or scrub, of the contact tips of said contact probes on the contact pads of the device under test. It is notoriously important to ensure the scrub of the contact tips so as to allow superficially scratching said contact pads, removing the impurities, for instance in the form of a thin oxide layer or film, thus improving the contact performed by the probe head.

All these features should be evaluated and calibrated in the manufacturing step of a probe head, since the proper electric connection between probes and device under test should always be ensured.

A critical parameter in making a probe head is the distance (the so-called pitch) between the centers of the contact pads being on the device under test. The pitch of the integrated electronic devices has in fact become smaller and smaller with the progress of the related manufacturing technologies, resulting in a high packing of the contact probes in the probe head, and causing positioning problems when mutual contact between the probes is to be avoided.

The possible approach or packing of the probes is therefore a function of the overall dimensions or transversal diameter of the probes in the packing direction, suitably increased by a clearance value linked to the process tolerances and to a minimum air value to be ensured between adjacent probes to avoid a possible contact between them under all operating conditions of the probe head.

The technical problem of the present invention is to provide a probe head having structural and functional features such as to allow overcoming the limitations and drawbacks still affecting the probe heads according to the prior art, in particular to avoid contact between adjacent probes, even in case of high packing of the contact probes for configurations of extremely close contact pads, i.e. with a very small pitch.

SUMMARY OF INVENTION

The solution idea underlying the present invention is to provide the probe head with a plurality of probes and micro contact probes connected by means of an elastic membrane configured to realize the desired mechanical and electric contact between said elements and at the same time allowing a spatial redistribution of the microprobes with respect to the probes thanks to a plurality of conductive paths created therein, the micro contact probes being used for contacting a device under test and being configured to get closer to each other with respect to the contact probes so as to allow the testing of devices with reduced pitch.

Based on this solution idea, the above technical problem is primarily solved by a probe head for a testing device of electronic devices integrated on a semiconductor wafer of the type comprising:

a first plurality of contact probes having a first transversal diameter;

a second plurality of micro contact probes having a second transversal diameter, smaller than the first transversal diameter of the contact probes of the first plurality, said transversal diameter being a maximum extension of a cross section of the contact probes of the first plurality and of the micro contact probes of the second plurality, even non-circular in shape; and a flexible membrane comprising suitable conductive tracks for electrically connecting a contact probe of the first plurality with a corresponding micro contact probe of the second plurality, the contact probes of the first plurality being arranged between the testing apparatus and the flexible membrane and the micro contact probes of the second plurality being arranged between the flexible membrane and a semiconductor wafer, the micro contact probes of the second plurality being configured to abut onto contact pads of a device under test integrated in the semiconductor wafer, each contact probe of the first plurality being in electrical contact with a corresponding micro contact probe of the second plurality through a conductive track of the flexible membrane and being configured to electrically connect the device under test with the testing apparatus.

More particularly, the invention comprises the following additional and optional features, taken alone or in combination if necessary.

According to an aspect of the invention, the micro contact probes of the second plurality may extend from a first face of the flexible membrane facing towards the device under test made on the semiconductor wafer.

According to another aspect of the invention, the conductive tracks of the flexible membrane may be configured to connect the micro contact probes of the second plurality with the contact probes of the first plurality spatially redistributed on a plane defined by the flexible membrane.

More particularly, the contact probes of the first plurality may have a first relative distance that is greater than a second relative distance of the micro contact probes of the second plurality, said relative distance being a distance between corresponding centers of respective contact areas with the flexible membrane.

The second relative distance of the micro contact probes of the second plurality may be equal to a pitch of the contact pads of the device under test, said pitch being a distance between centers of the contact pads.

More particularly, the first distance may vary from 40 μm to 250 μm, and the second relative distance may vary from 8 μm to 40 μm.

According to another aspect of the invention, the micro contact probes of the second plurality may be integral with the flexible membrane, thanks to a photolithographic growth process of the micro contact probes of the second plurality directly on the flexible membrane or fixed to the flexible membrane by an adhesive layer, such as a glue film or conductive rubber film interposed between the micro contact probes of the second plurality and the flexible membrane.

Furthermore, still according to another aspect of the invention, each contact probe of the first plurality may comprise a rod-shaped body ending with a first end portion configured to electrically connect with the flexible membrane and with a second end portion configured to electrically connect with the testing apparatus.

According to this aspect of the invention, the first end portion of each of the contact probes of the first plurality is configured to abut onto a contact pad of a plurality of contact pads made on a second face of the flexible membrane facing towards the testing apparatus, the contact pads of the flexible membrane having a pitch equal to the first relative distance of the contact probes of the first plurality, said pitch being a distance between centers of the contact pads, or the first end portion of each of the contact probes of the first plurality is fixedly attached to the flexible membrane at the second face, contact portions between end portions of each of the contact probes of the first plurality and the flexible membrane having centers at a distance equal to the first relative distance of the contact probes.

Furthermore, the second end portion of each of the contact probes of the first plurality may be configured to abut onto a respective contact pad of a plurality of contact pads made on a face of an interface board for the testing apparatus facing towards the probe head, the contact pads of the interface board having a pitch equal to or greater than said first relative distance of the contact probes, said pitch being a distance between centers of the contact pads, or the second end portion of each of the contact probes of the first plurality is fixedly attached to the interface board, contact portions between the second end portion of each of the contact probes of the first plurality and the interface board having centers at a distance equal to or greater than said first relative distance of the contact probes of the first plurality.

In particular, the first end, respectively the second end, of the contact probes of the first plurality may be fixedly constrained to the flexible membrane, respectively to the interface board, by a welding, or by an adhesive layer, such as a glue or conductive rubber film.

According to this aspect of the invention, the contact pads of said flexible membrane may have an area that is greater than an area of a transversal cross section of the micro contact probes of the second plurality.

According to another aspect of the invention, the probe head may further comprise at least one guide, possibly at least one pair of guides provided with respective guide holes configured to slidingly house the contact probes of the first plurality.

Furthermore, according to another aspect of the invention, each contact probe of the first plurality may comprise at least one pre-deformed section made in the probe body.

The micro contact probes of the second plurality may have a transversal section of a shape selected from round, oval, squared, rectangular, triangular and polygonal.

Furthermore, the micro contact probes of the second plurality may have a transversal diameter from 5 μm to 30 μm, preferably less than 10 μm and a height from 10 μm to 300 μm, preferably less than 200 μm.

According to another aspect of the invention, the contact probes of the first plurality may have a height greater than a height of the micro contact probes of the second plurality, height being an extension of the contact probes, respectively of the micro contact probes, in a longitudinal development direction.

Furthermore, according to another aspect of the invention, the micro contact probes of the second plurality may be made of a first conductive material selected from nickel, tungsten, cobalt, palladium or alloys thereof, such as the nickel-manganese, nickel-cobalt, nickel-palladium or nickel-tungsten, palladium-cobalt alloys, palladium-based ternary and quaternary alloys, preferably palladium-cobalt or preferably of a second conductive material selected from platinum, rhodium, palladium, silver, copper or an alloy thereof, preferably a platinum alloy, or a suitably doped semiconductor material.

The micro contact probes may also comprise an end portion or at least one insert made of a resistant material selected from rhodium and palladium, preferably rhodium.

According to this aspect of the invention, the contact probes of the first plurality are made of the first conductive material.

Furthermore, the flexible membrane may be made of a dielectric material, preferably polyamide, and have a thickness comprised between 10 µm and 100 µm, preferably equal to 50 µm.

Finally, according to another aspect of the invention, the conductive tracks may be made of a conductor material, preferably copper.

The characteristics and advantages of the probe head according to the invention will be apparent from the description, made hereinafter, of an embodiment thereof, given by way of indicative and non-limiting example, with reference to the enclosed drawings.

DETAILED DESCRIPTION OF THE INVENTION

Figure 1:
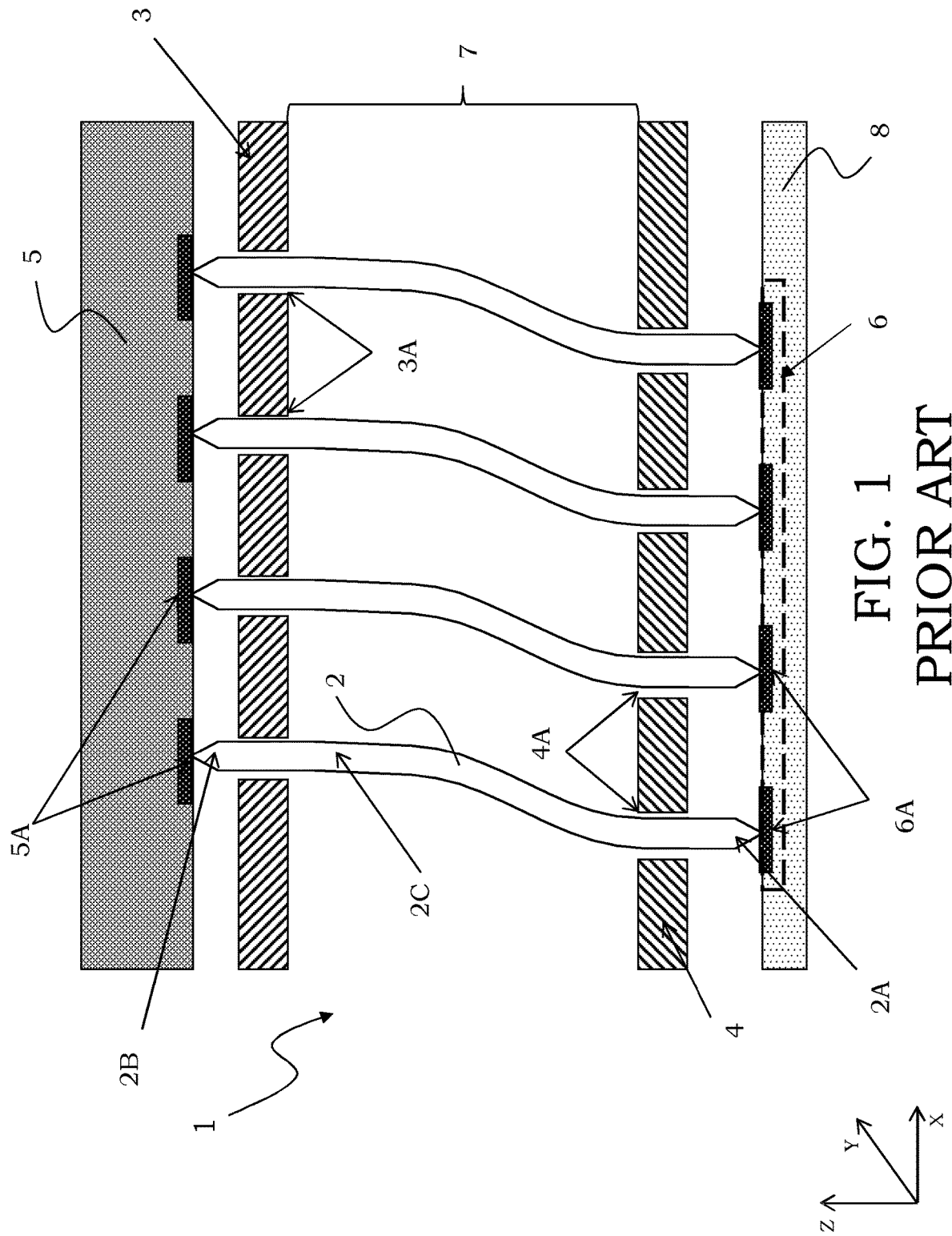
FIG. 1 schematically shows a probe head according to the prior art.
Figure 2:
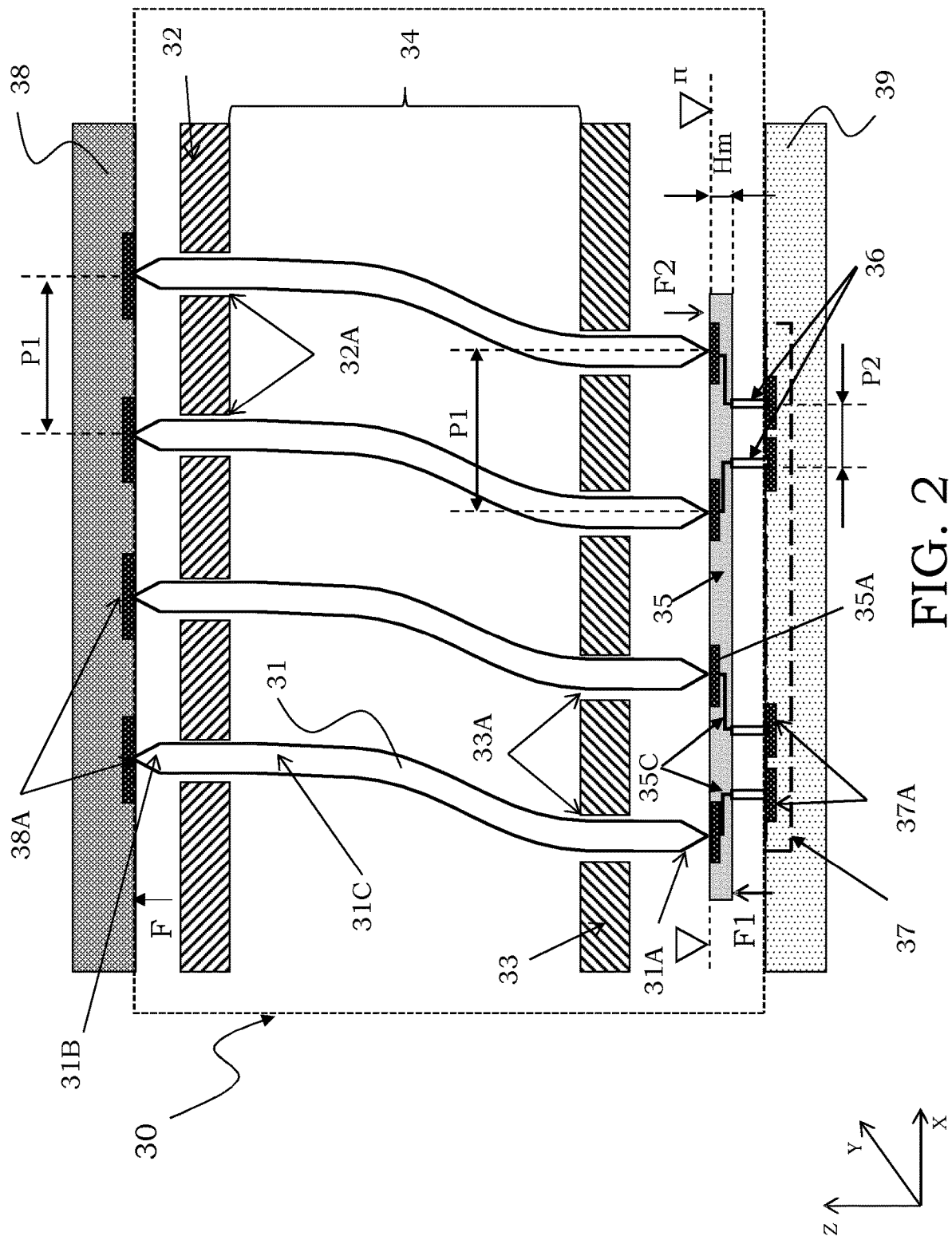
FIG. 2 schematically shows a probe head according to the present invention.

With reference to those figures, and in particular to FIG. 2, reference number 30 is globally and schematically indicates a probe head made according to the present invention.

It is worth noting that the figures represent schematic views and are not drawn to scale, but instead they are drawn so as to emphasize the important features of the invention. Furthermore, in the figures, the different elements are depicted in a schematic manner, their shape varying depending on the application desired. It is also worth noting that in the figures the same reference numbers refer to elements that are identical in shape or function. Finally, particular features described in relation to an embodiment illustrated in a figure are also applicable to the other embodiments illustrated in the other figures.

In its more general form, the probe head 30 is configured to connect with a testing apparatus (not shown in the figures) to perform the test of electronic devices integrated on a semiconductor wafer. More particularly, the probe head 30 is suitable for tests of integrated devices having a reduce pitch, for instance having pitches less than 40 µm.

As schematically illustrated in FIG. 2, the probe head 30 comprises at least one first plurality of contact probes 31 and a second plurality of micro contact probes 36 in mechanical and electrical contact with each other by a flexible membrane 35, comprising suitable conductive tracks 35C for connecting each contact probe 31 with a corresponding micro contact probe 36.

Suitably, the contact probes 31 have greater dimensions, in particular a greater transversal diameter, than the dimensions, in particular a transversal diameter, of the micro contact probes 36, the term "transversal diameter" indicating a maximum extension of a cross section of said probes, taken in a plane orthogonal to the z axis indicated in the figure, even not circular in shape. Furthermore, the contact probes 31 have a height that is greater than the height of the micro contact probes 36, the term "height" indicating an extension of the probes in a longitudinal development direction, according to the z axis indicated in the figure, when in their not deformed configuration.

For the contact probes 31, preferred values of the transversal diameter are from 20 µm to 50 µm, preferably greater than 30 µm, and preferred values of the height are from 2000 µm to 5000 µm, preferably greater than 3000 µm, whereas, for the micro contact probes 36, preferred values of the transversal diameter are from 5 µm to 30 µm, preferably less than 10 µm, and preferred values of the height are from 10 µm to 300 µm, preferably less than 200 µm. In other words, the micro contact probes 36 may have heights of at least an order of magnitude less than the contact probes 31.

The contact probes 31 are preferably made of a first conductive material selected from nickel, tungsten, cobalt, palladium or alloys thereof, such as the nickel-manganese, nickel-cobalt, nickel-palladium or nickel-tungsten, palladium-cobalt alloys, palladium-based ternary and quaternary alloys, preferably palladium-cobalt. Further coating materials may be used for instance at the end portions of the contact probes 31.

The micro contact probes 36 may be made of a first conductive material as the contact probes 31 or preferably of a second conductive material selected for instance platinum, rhodium, palladium, silver, copper or an alloy thereof, preferably a platinum alloy, or a suitably doped semiconductor material. Possibly, the micro contact probes 36 may be provided with an end portion, in particular configured to contact the contact pads of a device under test, made of a particularly resistant material, such as rhodium or palladium, preferably rhodium, or provided with a suitable insert made of this resistant material.

More particularly, the contact probes 31 extend between an interface plate or board 38, which is preferably a printed circuit board (PCB) which ensures the connection between the probe head 30 and the testing apparatus (not illustrated), and the flexible membrane 35, whereas the micro contact probes 36 extend from a first face F1 of the flexible membrane 35, in particular facing downwards according to the local reference of the figure, and a device under test 37 made on a semiconductor wafer 39.

Suitably, the micro contact probes 36 are configured to abut onto a plurality of pads or contact pads 37A of the device under test 37.

Thanks to the electric connection made by the conductive tracks 35C of the flexible membrane 35, the probe head 30 is configured to connect, by the series of a micro contact probe 36 and of a contact probe 31, each contact pads 37A of the device under test 37 with the interface board 38 (and therefore with the testing apparatus), thus ensuring the test of the device under test 37 integrated on the semiconductor wafer 39.

Suitably, the conductive tracks 35C are made so as to spatially redistribute the micro contact probes 36 with respect to the contact probes 31 on a plane n defined by the flexible membrane 35, parallel to the interface board 38 and to the device under test 37, all these elements may be substantially considered plane. More particularly, the contact probes 31 have respective first end portions or contact tips 31A resting on a second face F2 of the flexible membrane 35, opposite the first face F1, namely an upper face according to the local reference of the figure, facing towards the testing apparatus, and have a first relative distance P1 between corresponding centers of respective contact areas with the flexible membrane 35, whereas the micro contact probes 36 are made from the first face F1 of the flexible membrane 35 and have a second relative distance P2 between corresponding centers of respective contact areas with the flexible membrane 35, said second relative distance P2 being suitably less than the first relative distance P1 and corresponding to the pitch of the device under test 37, namely the distance between centers of the contact pads 37A thereof.

In this way, the flexible membrane 35, thanks to the conductive tracks 35C, performs a local redistribution, in particular a decrease, of the distance of the micro contact probes 36 with respect to the contact probes 31, thus acting as a space transformer inside the probe head 30.

More particularly, the first relative distance P1 may have a value varying from 40 µm to 250 µm, and the second relative distance P2 may have a value varying from 8 µm to 40 µm.

It is thus possible to overcome the problems linked to the undesired contact between adjacent probes, since the contact probes 31 that are larger in size are at a greater distance, whereas the micro contact probes 36 that are smaller in size may be close to each other, in particular according to the pitch of the contact pads 37A of the device under test 37, the contact of the contact probes 31 with the micro contact probes 36 that are spatially arranged differently being ensured by the conductive tracks 35C made in the flexible membrane 35.

Indeed, the micro contact probes 36 are spatially distributed according to the stringent constraints of the device under test 37 and of the contact pads 37A thereof, whereas the contact probes 31, which realize the connection with the interface board 38, may be distributed more freely and so as to ensure a sufficient distance between adjacent probes, thus minimizing—if not completely eliminating—the risks of contact with each other.

In the embodiment illustrated in FIG. 2, the contact probes 31 are vertical probes with free ends, which may be indicated as "loose" probes; each contact probe 31 comprises in particular a rod-shaped body 31C which ends with the first end portion or contact tip 31A and with a second end portion or contact head 31B, said ends not being fixedly fastened but configured so as to realize the electric contact, abutting onto corresponding contact pads.

In this way the probe head 30 also comprises a pair of plate-shaped supports or guides, in particular an upper die 32 and a lower die 33, parallel to each other and spaced apart by a free area or air gap 34. As seen in connection with the prior art, the upper die 32 and the lower die 33 comprise respective pluralities of guide holes 32A and 33A, configured to slidingly house the contact probes 31. Preferably, the upper die 32 and the lower die 33 are substantially plane and arranged according to the plane n, said upper die 32 and lower die 33 being parallel to the flexible membrane 35, to the interface board 38 and to the device under test 37. In this embodiment, the flexible membrane 35 comprises a plurality of contact pads 35A formed on the second face F2 thereof, whereonto the contact tips 31A of the contact probes 31 abut. Analogously, the interface board 38 comprises a plurality of contact pads 38A formed on a face F thereof, facing towards the probe head 30, namely downwards according to the local reference of the figure, whereonto the contact heads 31B of the contact probes 31 abut.

The first distance P1 between the contact probes 31 corresponds to the pitch of the contact pads 35A formed on the second face F2 of the flexible membrane 35 and, in this case, to the pitch of the contact pads 38A of the interface board 38 and to the pitch of the contact pads 35A of the flexible membrane 35 and the second distance P2 between the micro contact probes 36 corresponds to the pitch of the contact pads 37A of the device under test 37.

Suitably, the conductive tracks 35C of the flexible membrane 35 connect in this case the contact pads 35A formed on the second face F2 thereof with the micro contact probes 36, which extend from the first face F1 of the flexible membrane 35.

In a preferred embodiment, the micro contact probes 36 are grown by means of photolithographic process directly on the first face F1 of the flexible membrane 35, said process ensuring a high positioning precision of the micro contact probes 36 according to the x and y axes and therefore a correct positioning thereof with respect to the contact pads 37A of the device under test 37. In this way the micro contact probes 36 are integral with the flexible membrane 35. Alternatively, the micro contact probes 36 may be made integral with the flexible membrane 35, by means of an adhesive layer, such as a glue film or conductive rubber.

The flexible membrane 35 is made by means of a dielectric material, preferably polyamide, configured to provide the desired flexibility and the desired electrical insulation, whereas the conductive tracks are preferably made of a conductive material, preferably copper. Moreover, the flexible membrane 35 may have a thickness Hm comprised between 10 µm and 100 µm, preferably equal to 50 µm.

Figure 3A:
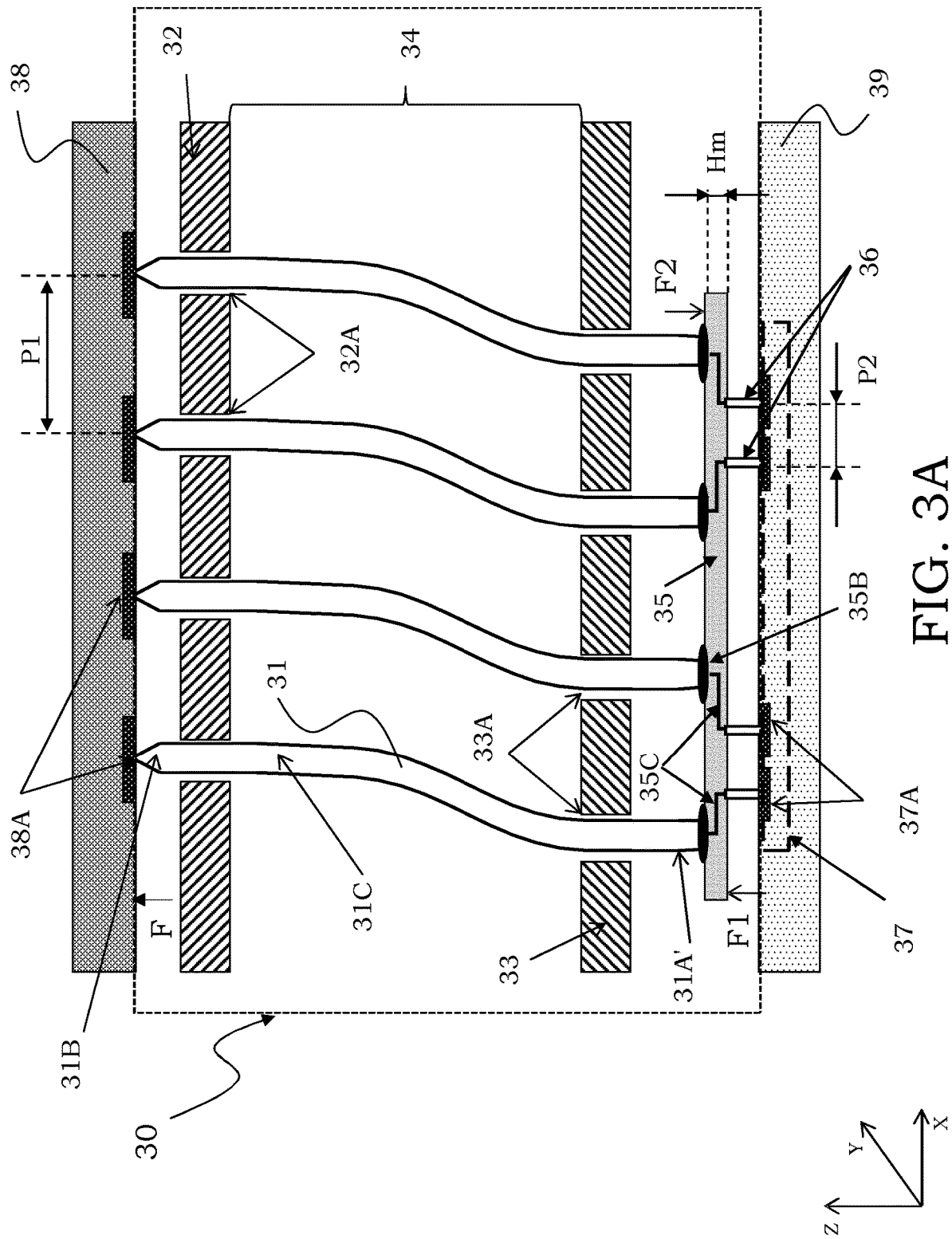
FIGS. 3A-3E schematically show alternative embodiments of a probe head according to the present invention.

In an alternative embodiment, schematically illustrated in FIG. 3A, the contact probes 31 may be fixedly fastened, preferably welded, to the flexible membrane 35 at the second face F2 thereof. In this case each contact probe 31 comprises a first end portion 31A' that comprises a welding portion 35B, connected in turn by means of the conductive tracks 35C to the micro contact probes 36, whereas the second end portion or contact head 31B of the contact probes 31 abuts onto the contact pads 38A of the interface board 38. As previously, the contact probes 31 are slidingly housed in the guide holes 32A and 33A of the upper die 32 and of the lower die 33.

In this case, the contact probes 31 have a single free end, namely the contact head 31B, while they are fixedly fastened, preferably welded, to the flexible membrane 35 at the first end 31A'.

It is also possible, instead of the welding, to use an adhesive layer, such as a glue or conductive rubber film, to fixedly fasten the contact probes 31 with the flexible membrane 35.

Figure 3B:
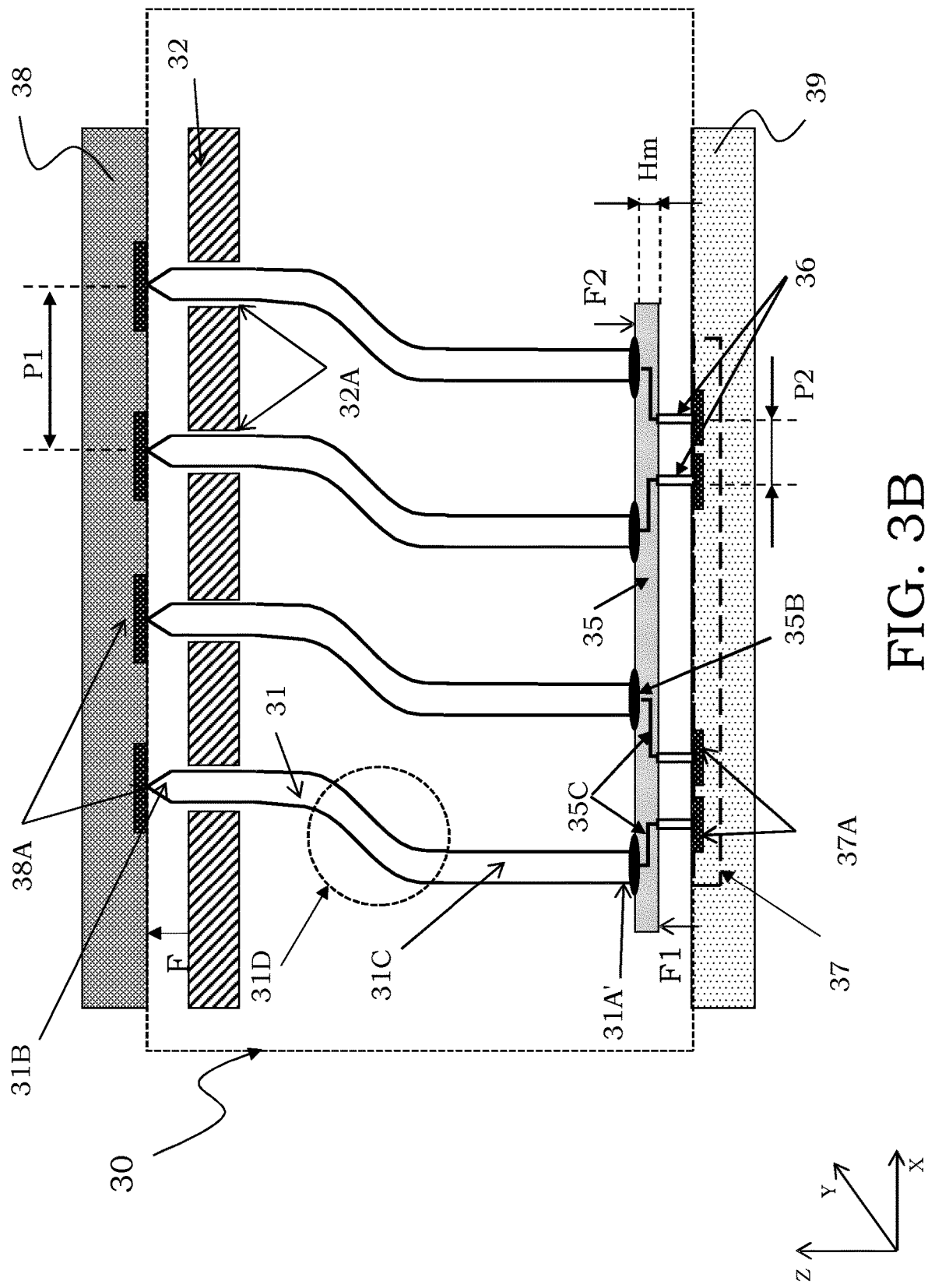

According to an alternative embodiment, schematically illustrated in FIG. 3B, the contact probes 31 are of the pre-deformed type. In this case, each contact probe 31 comprises at least one pre-deformed section 31D formed in the probe body 31C and configured to force a bending preferential direction of the contact probe 31 itself. In this case, the contact probes 31, which comprise the first end portion 31A' fixedly fastened, preferably welded, to the flexible membrane 35, are housed in a single die, in particular the upper die 32. The pre-deformed section 31D may have for instance an S-shape, as illustrated in FIG. 3B, or another shape, such as a C-shape.

Alternatively, the contact probes 31 may have, alternatively or additionally, a second fixedly fastened end portion 31B', preferably comprising a welding portion 38B made at the face F of the interface board 38.

Figure 3C:
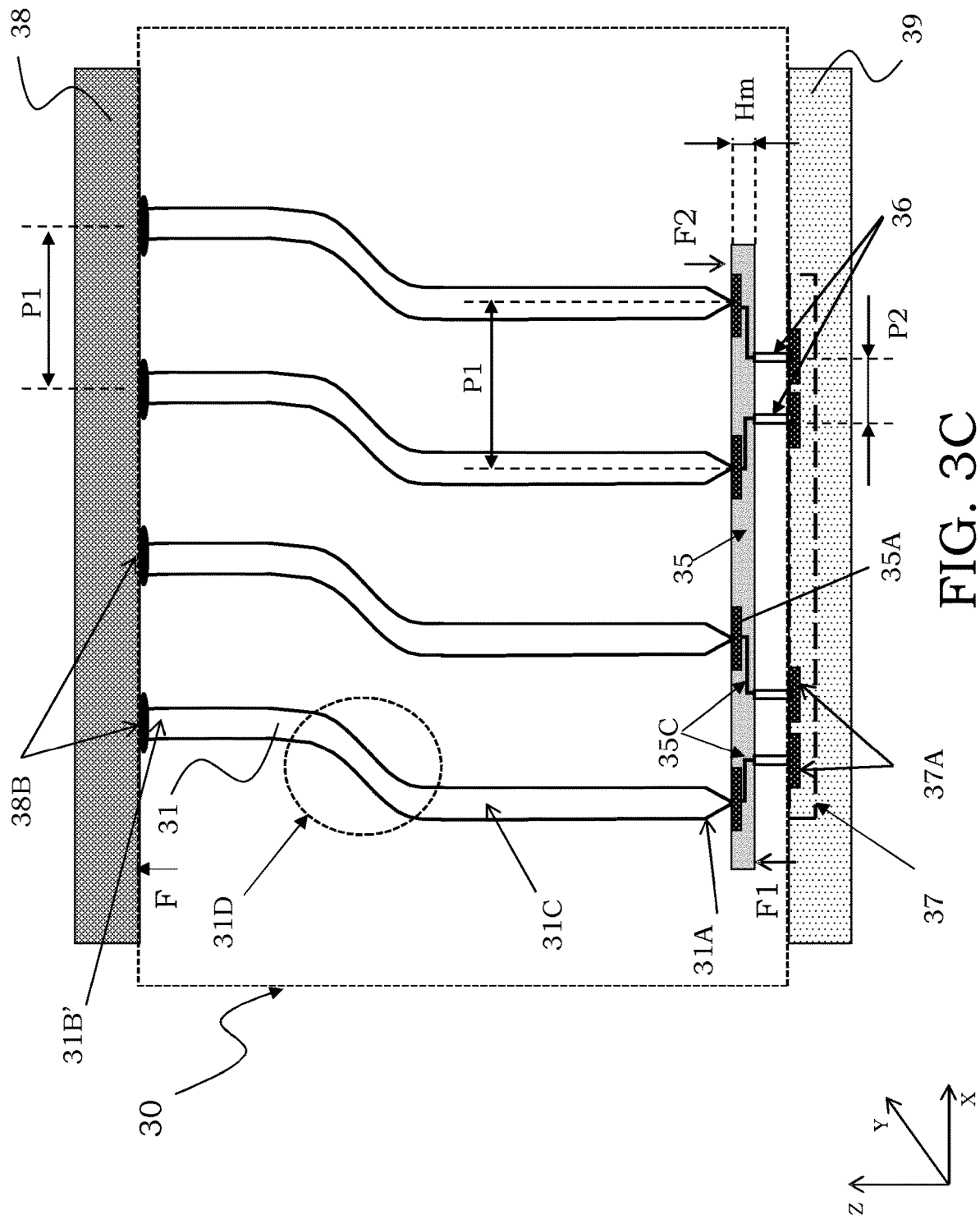

In the alternative embodiment illustrated in FIG. 3C, the contact probes 31 have first end portions or contact tips 31A that are free and configured to abut onto the contact pads 35A of the flexible membrane 35, second end portions 31B' that are fixedly constrained, preferably welded, to the interface board 38 and respective pre-deformed sections 31D formed in the probe body 31C; said contact probes 31, thanks to their fixed constrain with the interface board 38, are not housed in any die, being in this case "free body" probes, as above defined.

In this case as well, it is possible, instead of the welding, to use an adhesive layer, such as a glue or conductive rubber film, to fixedly fasten the contact probes 31 with the interface board 38.

Though not illustrated in the figures, it is also possible to make the contact probes 31 with both end portions fixedly fastened, preferably welded, to the flexible membrane 35 and to the interface board 38, respectively.

Figure 3D:
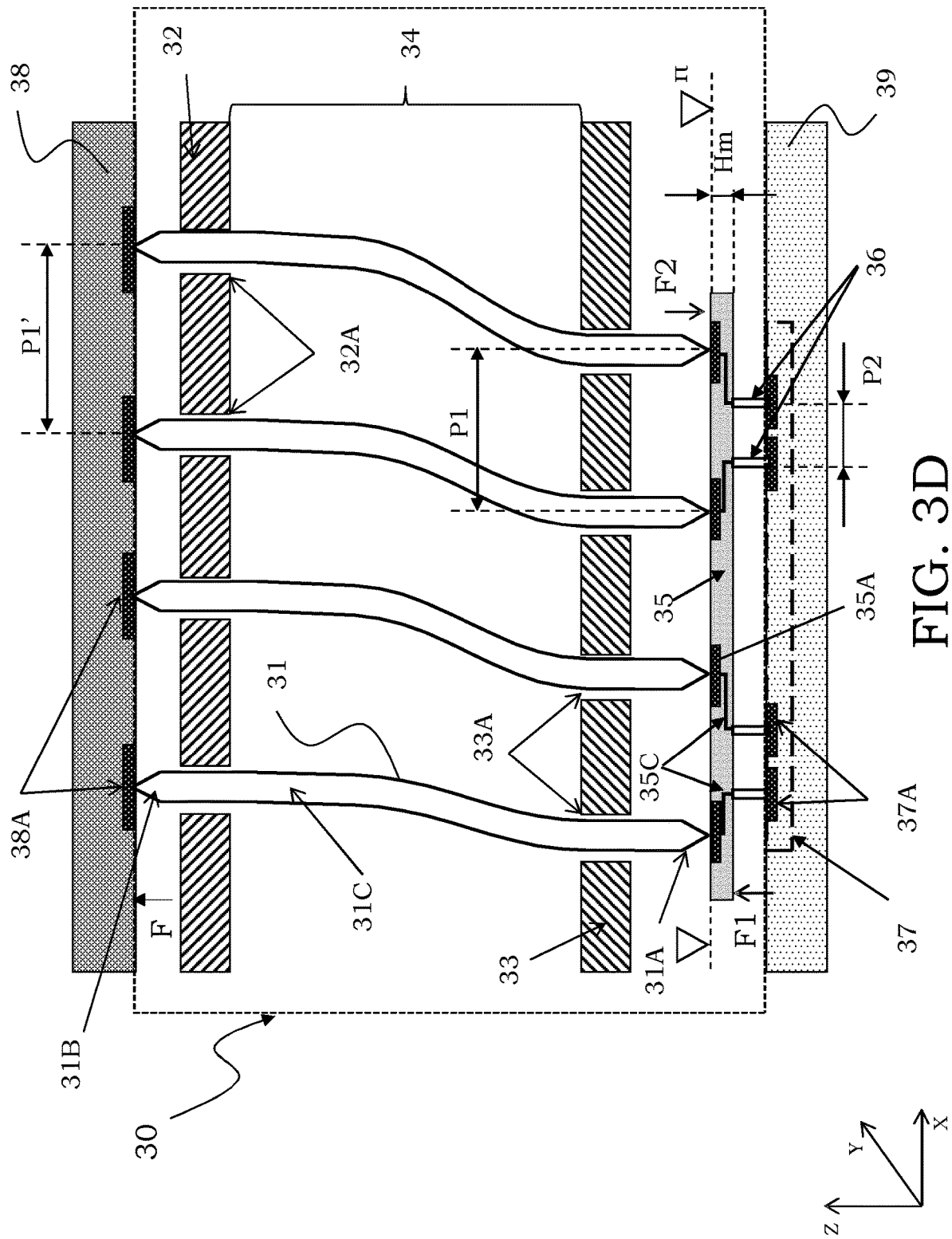

According to a further alternative embodiment, schematically illustrated in FIG. 3D with reference to a probe head with contact probes 31 having both the ends free, it is also possible to make the contact probes 31 so as to further space apart their contact heads 31B at the interface board 38. In this way, the contact pads 38A of the interface board 38 may be made with a pitch P1' greater than the pitch P1 between the contact pads 35A formed on the second face F2 of the flexible membrane 35. In particular, in the case illustrated in FIG. 3D, said further pitch widening is made by means of a deformation that is differentiated among the contact probes 31.

Though not illustrated in the figures, it is also possible to make this further pitch widening by tilting the contact probes 31 or through other measures such as the use of pre-deformed portions or extension arms.

Figure 3E:
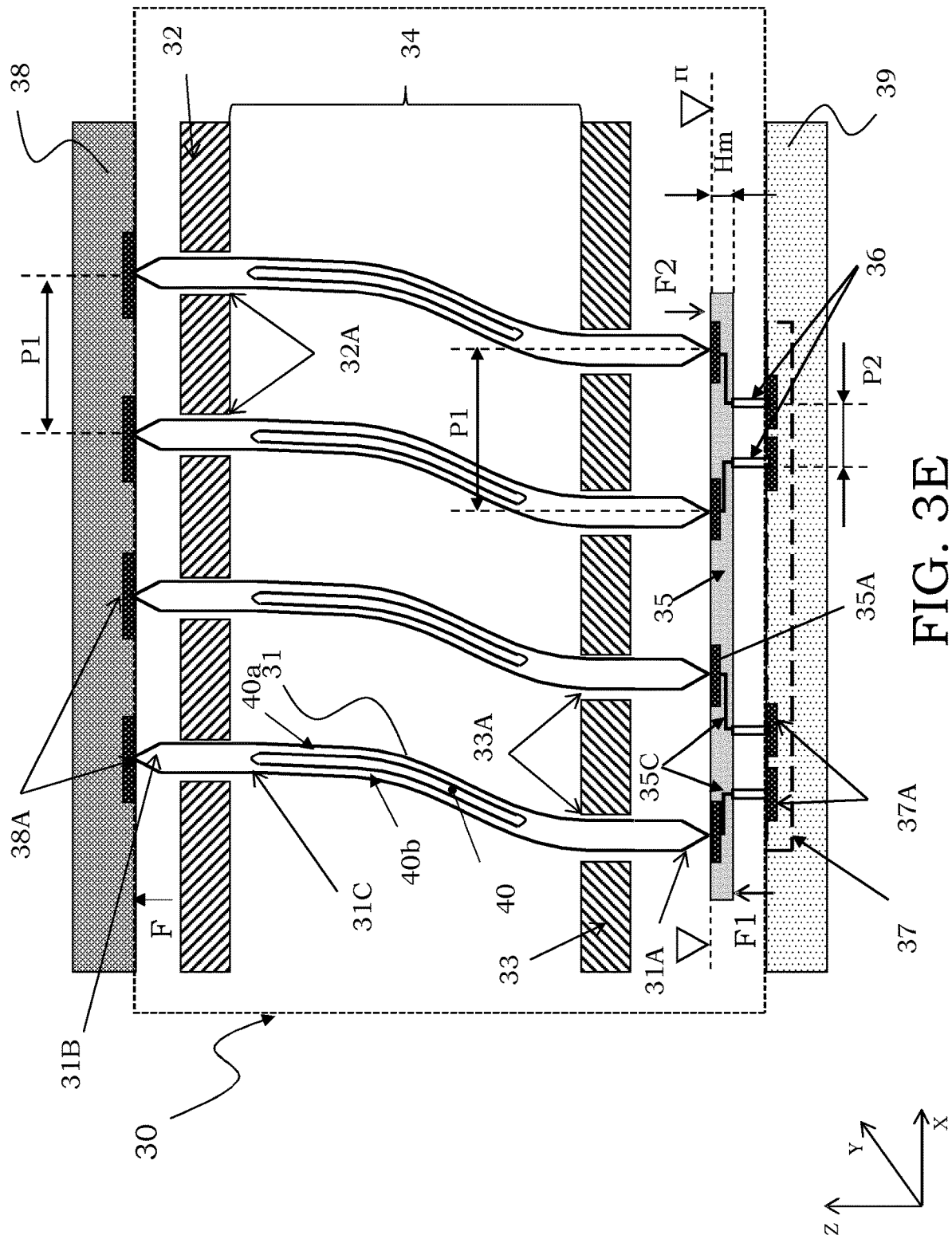

In the alternative embodiment illustrated in FIG. 3E, the probe body 31C comprises a cut or slot 40 that runs longitudinally along said probe body 31C and defines at least one pair of arms 40a and 40b.

It is obviously possible to make the probe body 31C even by a plurality of arms thanks to the realization of a corresponding plurality of longitudinal slots.

Suitably, the presence of the arms 40a and 40b formed in the probe body 31C is capable of decreasing the rigidity of the probe 31 as a whole and as a result the pressure exerted thereby onto the respective contact pads, while maintaining a sufficient elasticity of the probe body capable of ensuring the bending thereof during the pressing contact onto the contact pads, in particular the contact pads 35A of the flexible membrane 35.

Furthermore, it is emphasized that it is possible to make a probe head 30 having a first pitch widening made by the flexible membrane 35, in particular thanks to the use of the micro contact probes 36 protruding from the first face F1 of the flexible membrane 35 and connected to the contact probes 31 by means of the conductive tracks 35C, and a second pitch widening made by the contact probes 31 towards the interface board 38, for instance thanks to suitable deformations, inclinations or configurations thereof, even in the case of contact probes 31 fixedly fastened, in particular welded, at the flexible membrane 35 and/or at the interface board 38, the pitch being defined in this case as the distance between the centers of the contact portions between contact probes 31 and flexible membrane 35 and/or interface board 38, indeed.

Figure 4:
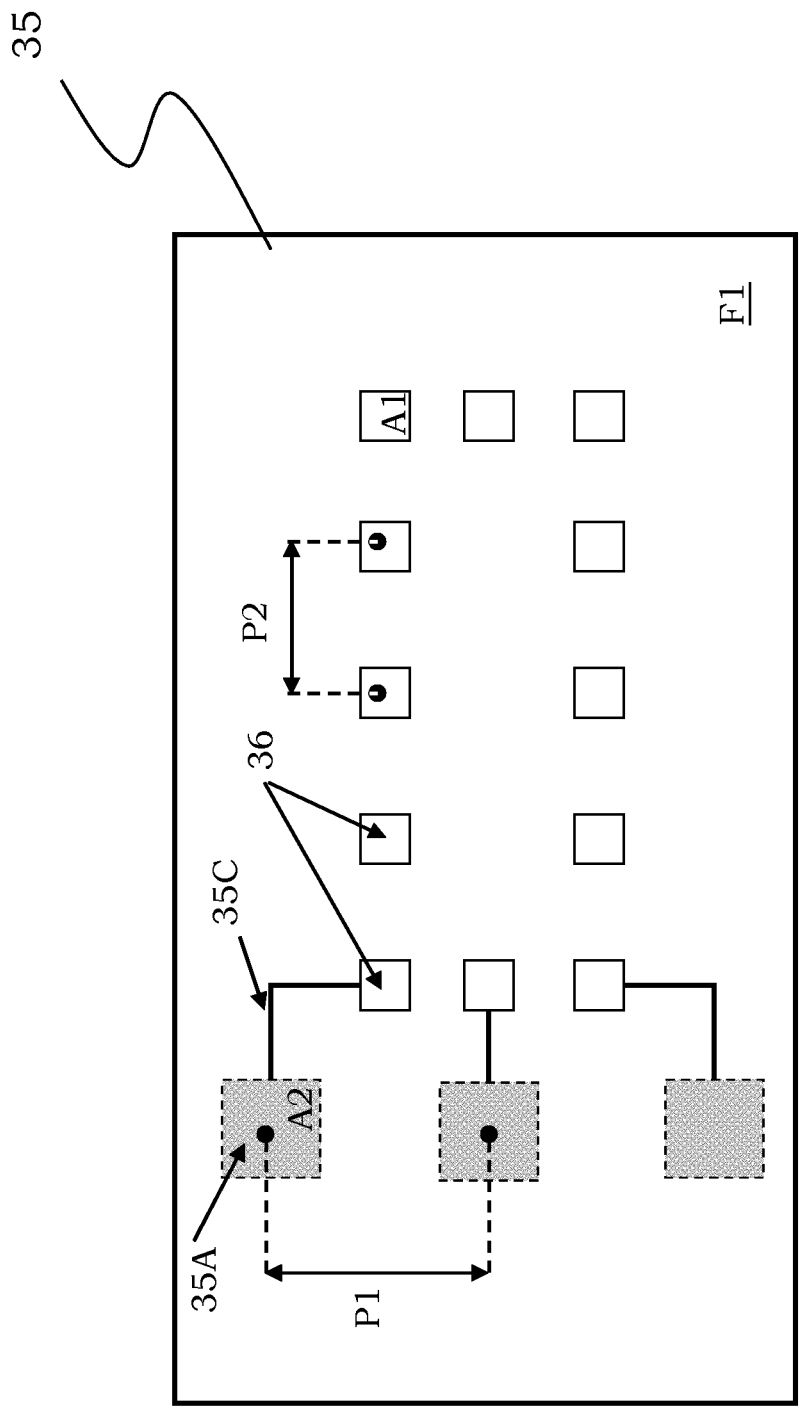
FIG. 4 schematically shows from above a membrane comprised in the probe heads according to the invention.
Figure 4:
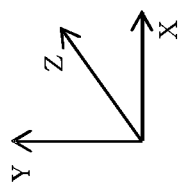

As previously indicated, the conductive tracks 35C made inside the flexible membrane 35 allow spatially redistributing the contact pads 35A made on the second face F2 thereof with respect to the micro contact probes 36 protruding in the direction of the device under test 37 from the first face F1 of the flexible membrane 35, as schematically illustrated in FIG. 4.

More particularly, the micro contact probes 36 are arranged on the first face F1 of the flexible membrane 35 correspondently to the distribution of the contact pads 37A of the device under test 37, namely according to a distance or pitch P2 corresponding to that of the device under test 37. As in the embodiment illustrated in FIG. 3A, said micro contact probes 36 are thus electrically connected to the contact pads 35A made on the second face F2 of the flexible membrane 35 by means of the conductive tracks 35C, the contact pads 35A being spatially distributed differently with respect to the micro contact probes 36, in particular having a distance or pitch P1 greater than the pitch P1 of the device under test 37.

It is thus possible to loosen the distance constraints between the contact pads 35A and thus between the contact probes 31, which thus may have dimensions, namely a transversal diameter, greater than the micro contact probes 36.

Suitably, the contact pads 35A made on the second face F2 of the flexible membrane 35 may further have an area A2 equal to or greater than an area A1 of the cross section of the micro contact probes 36. Preferably, the area A2 of the contact pads 35A is equal to 1.5-3 times the area A1 of the cross section of the micro contact probes 36 (A2=1.5–3*A1). More preferably, the area A2 of the contact pads 35A is equal to double the area A1 of the cross section of the micro contact probes 36.

It is also emphasized that the possibility to use contact pads 35A having greater dimensions than the micro contact probes 36 is ensured by the use of the conductive tracks 35C and by the resulting possibility of suitably distribute them on the second face F2 of the flexible membrane 35.

The spatial redistribution of the contact probes 31 with respect to the micro contact probes 36 is obviously possible even in the case of probes that are fixedly fastened, in particular welded, to the flexible membrane 35. In this case, the welding portions 35B, still suitably connected to the micro contact probes 36 by means of the conductive tracks 35C, will be made with a distance or pitch P1 greater than the pitch P1 of the device under test 37.

Furthermore, it is emphasized that it is possible to make the micro contact probes 36 with cross sections of different shapes, as schematically illustrated in FIGS. 5A-5F.

Figure 5C:
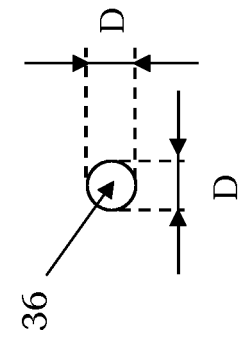
FIGS. 5A-5F schematically show possible cross sections of micro probes comprised in the probe heads according to the invention.
Figure 5F:
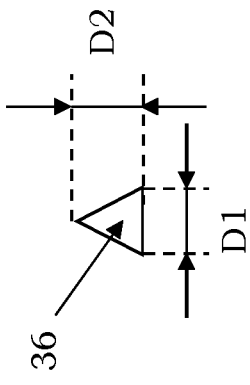
Figure 5B:
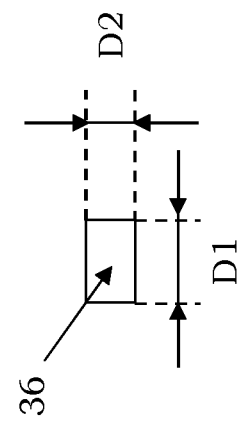
Figure 5E:
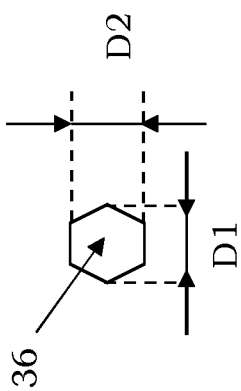
Figure 5A:
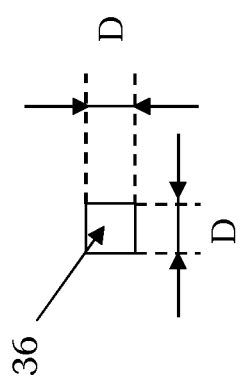

In particular, said micro contact probes 36 may have a squared section with side D, as illustrated in FIG. 5A, or rectangular having sides D1 and D2 as illustrated in FIG. 5B.

Figure 5D:
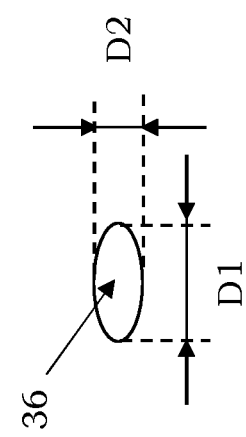

Analogously, the micro contact probes 36 may have a circular section with diameter D, as illustrated in FIG. 5C, or an oval section with diameters D1 and D2, as illustrated in FIG. 5D.

More generally, the micro contact probes 36 may have sections of any polygonal shape, such as a hexagonal section with dimensions D1 and D2 as illustrated in FIG. 5E, or a triangular section having a base D1 and a height D2, as illustrated in FIG. 5F.

Preferred shapes for the sections of the micro contact probes 36, taking into account the usual passage of said micro contact probes 36 on an abrasive cloth for rounding the end portions thereof, are the shapes illustrated in FIGS. 5A and 5C, being these shapes the ones that may be more easily rounded.

Obviously, the shapes of the sections of the micro contact probes 36 are not intended in a geometrically perfect sense, but as the shape of a physical object which therefore has tolerances and manufacturing inaccuracies.

It should be noted that it is possible to make the micro contact probes 36 with a variety of different sections also by virtue of their reduced dimensions and of the possibility of photolithographically growing them directly on the flexible membrane 35.

It is also possible to make the contact probes 31 with a cross section having a shape chosen from a circular, squared or rectangular one.

It is also possible to make contact pads having a non-squared shape such as the one illustrated by way of example in the figures.

Advantageously according to the present invention, the proposed probe head is configured to make an internal space transformation thanks to the flexible membrane, so as to use micro contact probes for contacting the contact pads of the device under test, said micro probes being extremely small in size and therefore configured to be close to each other up to very small pitches, suitable for devices made with the latest technologies. In particular, the micro contact probes may be closer to each other than the contact probes.

Furthermore advantageously, the transport of signals from the micro contact probes to the interface board with the testing apparatus occurs through the contact probes, avoiding the problems associated with the known probe heads for RF applications, which include membranes provided with microprobes resting on a shock-absorbing bearing and flexible metal tracks made in the flexible membrane for the connection with the interface board and with the testing apparatus. These flexible metal tracks move with the membrane and are difficult to make, since they extend along the entire membrane up to the interface board and deform therewith during the normal operation of the probe head. Suitably, the micro contact probes may be grown by a photolithographic process directly on the flexible membrane, said process allowing to obtain a high spatial positioning precision of the micro contact probes on the flexible membrane. Such precision cannot be obtained with the traditional contact probes, which have problems of straightness and tolerances due to their housing in the guide holes.

Advantageously, the probe head may also be repaired during its useful life by replacing the flexible membrane provided with the micro contact probes when they have worn out. This replacement will be even easier in the embodiments in which the contact probes abut onto the flexible membrane suitably provided in this case with contact pads. It is therefore evident that, thanks to this ease of replacement of the flexible membrane with consequent repair of the probe head, for instance in case of consumption of the micro contact probes, such a probe head may also be advantageously used for non-reduced pitch applications.

Obviously, a person skilled in the art, in order to meet contingent and specific requirements, may make to the probe head above described numerous modifications and variations, all included in the scope of protection of the invention as defined by the following claims.

For example, it is possible to use a flexible membrane with conductive tracks and contact pads made on the same face and connected to the micro contact probes protruding from the opposite face by vias or conductive holes that cross the flexible membrane.

The invention claimed is:

1. A probe head for a testing apparatus of electronic devices integrated on a semiconductor wafer comprising:
   a first plurality of contact probes having a first transversal diameter;
   a second plurality of micro contact probes having a second transversal diameter, smaller than the first transversal diameter of the contact probes of the first plurality, transversal diameter meaning a maximum extension of a cross section of the contact probes of the first plurality and of the micro contact probes of the second plurality, even non-circular in shape; and
   a flexible membrane comprising suitable conductive tracks for electrically connecting a contact probe of the first plurality with a corresponding micro contact probe of the second plurality,
   the contact probes of said first plurality being arranged between the testing apparatus and the flexible membrane, and
   the micro contact probes of the second plurality being arranged between the flexible membrane and a semiconductor wafer,
   the micro contact probes of the second plurality being configured to abut onto contact pads of a device under test integrated in the semiconductor wafer,
   each contact probe of the first plurality being in electrical contact with a corresponding micro contact probe of the second plurality through a conductive track of the flexible membrane so to electrically connect the device under test with the testing apparatus;
   wherein the micro contact probes of the second plurality are integral with the flexible membrane due to a photolithographic growth process of the micro contact probes of the second plurality directly on the flexible membrane.

2. The probe head of claim 1, wherein the flexible membrane has a first face facing towards the device under test and the micro contact probes of the second plurality extend from the first face.

3. The probe head of claim 2, wherein the flexible membrane define a plane and the conductive tracks of the flexible membrane are configured to connect the micro contact probes of the second plurality with the contact probes of the first plurality spatially redistributed on the plane defined by the flexible membrane.

4. The probe head of claim 3, wherein the contact probes of the first plurality have a first relative distance that is greater than a second relative distance of the micro contact probes of the second plurality, relative distance meaning a distance between corresponding centers of respective contact areas with the flexible membrane.

5. The probe head of claim 4, wherein the second relative distance of the micro contact probes of the second plurality is equal to a pitch of the contact pads of the device under test, pitch meaning a distance between centers of the contact pads.

6. The probe head of claim 1, wherein the micro contact probes of the second plurality are fixed to the flexible membrane by an adhesive layer interposed between the micro contact probes of the second plurality and the flexible membrane.

7. The probe head of claim 1, wherein each contact probe of the first plurality comprises a rod-shaped body ending with a first end portion that is configured to electrically connect with the flexible membrane and with a second end portion configured to electrically connect with the testing apparatus.

8. The probe head of claim 7, wherein the flexible membrane has a second face facing towards the testing apparatus and comprising a plurality of contact pads and the first end portion of each of the contact probes of the first plurality is configured to abut onto a contact pad of a plurality of contact pads made on the second face of the flexible membrane and wherein the contact pads of the flexible membrane have a pitch equal to the first relative distance of the contact probes of the first plurality, pitch meaning a distance between centers of the contact pads.

9. The probe head of claim 8, wherein the contact pads of the flexible membrane have an area that is greater than an area of a cross-section of the micro contact probes of the second plurality.

10. The probe head of claim 7, wherein the second end portion of each of the contact probes of the first plurality is configured to abut onto a respective contact pad of a plurality of contact pads made on a face of an interface board configured to connect to the testing apparatus, the face facing towards the probe head and the contact pads of the interface board having a pitch equal to or greater than the first relative distance of the contact probes of the first plurality, pitch meaning a distance between centers of the contact pads.

11. The probe head of claim 7, wherein the second end portion of each of the contact probes of the first plurality is fixedly attached to an interface board configured to connect to the testing apparatus, contact portions between the second end portion of each of the contact probes of the first plurality and the interface board having centers at a distance equal to or greater than the first relative distance of the contact probes of the first plurality.

12. The probe head of claim 1, wherein each contact probe of the first plurality comprises at least one pre-deformed section in a probe body.

13. The probe head of claim 1, wherein the micro contact probes of the second plurality have cross-section of a shape selected from round, oval, squared, rectangular, triangular and polygonal.

14. The probe head of claim 1, wherein the contact probes of the first plurality have a height greater than a height of the micro contact probes of the second plurality, height meaning an extension of the contact probes and of the micro contact probes in a longitudinal development direction.

15. The probe head of claim 1, wherein the micro contact probes of the second plurality and the contact probes of the first plurality are made of a conductive material selected from nickel, tungsten, cobalt, palladium or alloys thereof, platinum, rhodium, palladium, silver, copper or an alloy thereof, or a doped semiconductor material, the flexible membrane is made of a dielectric material and the conductive tracks are made of a conductor material.

16. The probe head of claim 15, wherein the alloy is selected from the group consisting of nickel-manganese, nickel-cobalt, nickel-palladium or nickel-tungsten, palladium-cobalt alloys, palladium-based ternary and quaternary alloys.

17. The probe head of claim 15, wherein the micro contact probes comprise a portion chosen between an end portion or an insert and being made of a resistant material selected from rhodium and palladium.

18. The probe head of claim 1, wherein the contact probes of the first plurality have a probe body comprising a slot that runs longitudinally along the probe body and defines at least one pair of arms.

19. A probe head for a testing apparatus of electronic devices integrated on a semiconductor wafer comprising:
a first plurality of contact probes having a first transversal diameter;
a second plurality of micro contact probes having a second transversal diameter, smallercarb than the first transversal diameter of the contact probes of the first plurality, transversal diameter meaning a maximum extension of a cross section of the contact probes of the first plurality and of the micro contact probes of the second plurality, even non-circular in shape; and
a flexible membrane comprising suitable conductive tracks for electrically connecting a contact probe of the first plurality with a corresponding micro contact probe of the second plurality,
the contact probes of said first plurality being arranged between the testing apparatus and the flexible membrane, and
the micro contact probes of the second plurality being arranged between the flexible membrane and a semiconductor wafer,
the micro contact probes of the second plurality being configured to abut onto contact pads of a device under test integrated in the semiconductor wafer,
each contact probe of the first plurality being in electrical contact with a corresponding micro contact probe of the second plurality through a conductive track of the flexible membrane so to electrically connect the device under test with the testing apparatus;
wherein each contact probe of the first plurality comprises a rod-shaped body ending with a first end portion that is configured to electrically connect with the flexible membrane and with a second end portion configured to electrically connect with the testing apparatus; and
wherein the flexible membrane has a second face facing towards the testing apparatus and the first end portion of each of said contact probes of the first plurality is fixedly attached to the flexible membrane in correspondence of the second face, contact portions between end portions of each of the contact probes of the first plurality and the flexible membrane having centers at a distance equal to the first relative distance of the contact probes.

20. A probe head for a testing apparatus of electronic devices integrated on a semiconductor wafer comprising:
a first plurality of contact probes having a first transversal diameter;
a second plurality of micro contact probes having a second transversal diameter, smaller than the first transversal diameter of the contact probes of the first plurality, transversal diameter meaning a maximum extension of a cross section of the contact probes of the first plurality and of the micro contact probes of the second plurality, even non-circular in shape; and
a flexible membrane comprising suitable conductive tracks for electrically connecting a contact probe of the first plurality with a corresponding micro contact probe of the second plurality,
the contact probes of said first plurality being arranged between the testing apparatus and the flexible membrane, and the micro contact probes of the second plurality being arranged between the flexible membrane and a semiconductor wafer,
the micro contact probes of the second plurality being configured to abut onto contact pads of a device under test integrated in the semiconductor wafer,
each contact probe of the first plurality being in electrical contact with a corresponding micro contact probe of the second plurality through a conductive track of the flexible membrane so to electrically connect the device under test with the testing apparatus;
wherein each contact probe of the first plurality comprises a rod-shaped body ending with a first end portion that is configured to electrically connect with the flexible membrane and with a second end portion configured to electrically connect with the testing apparatus; and
wherein the first end of each contact probe of the first plurality is fixedly attached to the flexible membrane and the second end of each contact probe of the first plurality is fixedly attached to the interface board.

\* \* \* \* \*